United States Patent
Li et al.

(10) Patent No.: US 10,973,153 B2
(45) Date of Patent: Apr. 6, 2021

(54) POWER MODULE

(71) Applicant: Delta Electronics, Inc., Taoyuan (CN)

(72) Inventors: Wenhua Li, Shanghai (CN); Xueliang Chang, Shanghai (CN); Yahong Xiong, Shanghai (CN); Qinghua Su, Shanghai (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/690,444

(22) Filed: Nov. 21, 2019

(65) Prior Publication Data

US 2020/0187380 A1  Jun. 11, 2020

(30) Foreign Application Priority Data

Dec. 7, 2018 (CN) .......................... 201811494055.7

(51) Int. Cl.
*H05K 7/20* (2006.01)
*H05K 1/02* (2006.01)

(52) U.S. Cl.
CPC .......... *H05K 7/209* (2013.01); *H05K 1/0203* (2013.01); *H05K 1/0298* (2013.01); *H05K 7/20418* (2013.01); *H05K 7/20436* (2013.01)

(58) Field of Classification Search
None
See application file for complete search history.

(56) References Cited

U.S. PATENT DOCUMENTS

| | | | | |
|---|---|---|---|---|
| 7,623,349 B2 * | 11/2009 | Refai-Ahmed | ...... | H05K 1/0203 174/252 |
| 7,667,970 B2 * | 2/2010 | Ma | ...... | H01L 23/4006 361/704 |
| 8,531,841 B2 * | 9/2013 | Lee | ...... | H05K 7/209 361/708 |
| 9,161,475 B2 * | 10/2015 | Ng | ...... | H05K 7/1487 |
| 9,226,430 B2 * | 12/2015 | Kim | ...... | H01L 23/49833 |
| 9,322,580 B2 * | 4/2016 | Hershberger | ...... | H01L 35/32 |

(Continued)

FOREIGN PATENT DOCUMENTS

| | | |
|---|---|---|
| CN | 1442902 A | 9/2003 |
| CN | 203457035 U | 2/2014 |

*Primary Examiner* — Courtney L Smith
(74) *Attorney, Agent, or Firm* — Kirton McConkie; Evan R. Witt

(57) ABSTRACT

The present disclosure provides a power module including a circuit board, a first heat-generating component and a second heat-generating component. The circuit board includes a first side and a second side opposite to each other and includes a first plane and second plane disposed on the first side. A first height difference is formed between the first plane and the second plane. The first heat-generating component and the second heat-generating component are disposed on the first plane and the second plane, respectively. The first heat-generating component and the second heat-generating component include a first contact surface and a second contact surface, respectively. The first contact surface and the second contact surface are located at a first collaborative plane of the power module. It benefits to reduce the design complexity of a heat sink, and enhance the heat dissipation capability and the overall power density of the power module simultaneously.

21 Claims, 14 Drawing Sheets

(56) References Cited

U.S. PATENT DOCUMENTS

| | | | |
|---|---|---|---|
| 9,917,031 B2* | 3/2018 | Soyano | H01L 23/36 |
| 10,278,279 B1* | 4/2019 | Sultenfuss | H05K 1/165 |
| 2009/0243079 A1* | 10/2009 | Lim | H01L 23/5382 |
| | | | 257/691 |
| 2011/0013365 A1* | 1/2011 | Oota | B62D 5/0406 |
| | | | 361/707 |
| 2012/0075807 A1* | 3/2012 | Refai-Ahmed | H01L 25/0652 |
| | | | 361/719 |
| 2016/0155682 A1* | 6/2016 | Ahuja | H01L 23/36 |
| | | | 257/717 |

* cited by examiner

POWER MODULE

FIELD OF THE DISCLOSURE

The present disclosure relates to a power module, and more particularly to a power module having an optimized circuit board.

BACKGROUND OF THE DISCLOSURE

On-board high-power DC/DC power modules are widely used in telephony, data centers, and supercomputers. However, with the rapid development of landline and mobile communication, the requirements for output power and efficiency of on-board high-power DC/DC power modules are also increasing. On the other hand, with the trend of increasingly miniaturized communication products, it is inevitable that the power module used can increase the efficiency while reducing the volume to increase the power density. Therefore, the heat dissipation problem of the on-board high-power DC/DC power module at high power density is also becoming more and more serious, and its design for heat dissipation is becoming more and more complicated.

A conventional on-board high-power DC/DC power module is soldered to a system board through pins, and at least one heat-generating component of the power module is disposed on a circuit board of the power module. Heat of the heat-generating component can be dissipated through, for example, a heat sink. However, when two heat-generating components of different heights are disposed on the circuit board, the bottom surface of the heat sink has to form a stepped structure according to the two different heights of two heat-generating components, so as to dissipate the heat generated from the two heat-generating components. It results in a longer design cycles for the heat sink and the complexity in the production process is increased.

Therefore, there is a need of providing a power module to overcome the above drawbacks.

SUMMARY OF THE DISCLOSURE

An object of the present disclosure is to provide a power module. By optimizing the circuit board to carry heat-generating components with different heights, a collaborative plane is formed to facilitate the assembly of heat sink disposed thereon. It benefits to reduce the design complexity of the heat sink. The problem of the heat dissipation assembly structure of, for example, the DC/DC power modules is solved. Thus, the heat dissipation capability and the overall power density of the power module are enhanced simultaneously.

Another object of the present disclosure is to provide a power module. By flattening a plurality of contact surfaces of the power module into a collaborative plane, the process of assembling and fixing the power module to the heat sink and the system board is simplified. Consequently, the labor-saving is achieved, the production cost is reduced, and the reliability of the assembled structure is improved.

Other object of the present disclosure is to provide a power module. By flattening a plurality of contact surfaces of the power module and the metal contact surface of the metal device into a collaborative plane, the process of assembling and fixing the power module to the heat sink and the system board is simplified. Moreover, it is more helpful to increase the pressure resistance and the supporting ability of the power module. Consequently, the size of the heat dissipation device in the entire assembling structure is reduced, the heat dissipation capability is enhanced and the purpose of improving the overall power density is achieved. In addition, the packaging of the plastic sealing layer can further effectively eliminate the tolerance of the total height of the power module in mass production, and enhance the convenience of assembly of the power module.

In accordance with an aspect of the present disclosure, a power module is provided. The power module includes a circuit board, at least one first heat-generating component and at least one second heat-generating component. The circuit board includes a first side and a second side opposite to each other and includes at least one first plane and at least one second plane disposed on the first side. A first height difference is formed between the at least one first plane and the at least one second plan. The at least one first heat-generating component and the at least one second heat-generating component are disposed on the at least one first plane and the at least one second plane, respectively. The at least one first heat-generating component and the at least one second heat-generating component include at least one first contact surface and at least one second contact surface, respectively. The at least one first contact surface and the at least one second contact surface are located at a first collaborative plane of the power module.

In accordance with another aspect of the present disclosure, a power module is provided. The power module includes a circuit board, at least one first heat-generating component, at least one second heat-generating component, at least one third heat-generating component and at least one fourth heat-generating component. The circuit board includes a first side and a second side opposite to each other. The circuit board includes at least one first plane, at least one second plane, at least one third plane and at least one fourth plane. The at least one first plane and the at least one second plane are disposed on the first side and a first height difference is formed between the at least one first plane and the at least one second plane. The at least one third plane and the at least one fourth plane are disposed on the second side and a second height difference is formed between the at least one third plane and the at least one fourth plane. The at least one first heat-generating component and the at least one second heat-generating component are disposed on the at least one first plane and the at least one second plane, respectively. The at least one first heat-generating component includes at least one first contact surface, the at least one second heat-generating component includes at least one second contact surface, and the at least one first contact surface and the at least one second contact surface are located at a first collaborative plane of the power module. The at least one third heat-generating component and the at least one fourth heat-generating component are disposed on the at least one third plane and the at least one fourth plane, respectively. The at least one third heat-generating component includes at least one third contact surface, the at least one fourth heat-generating component includes at least one fourth contact surface, and the at least one third contact surface and the at least one fourth contact surface are located at a second collaborative plane of the power module.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
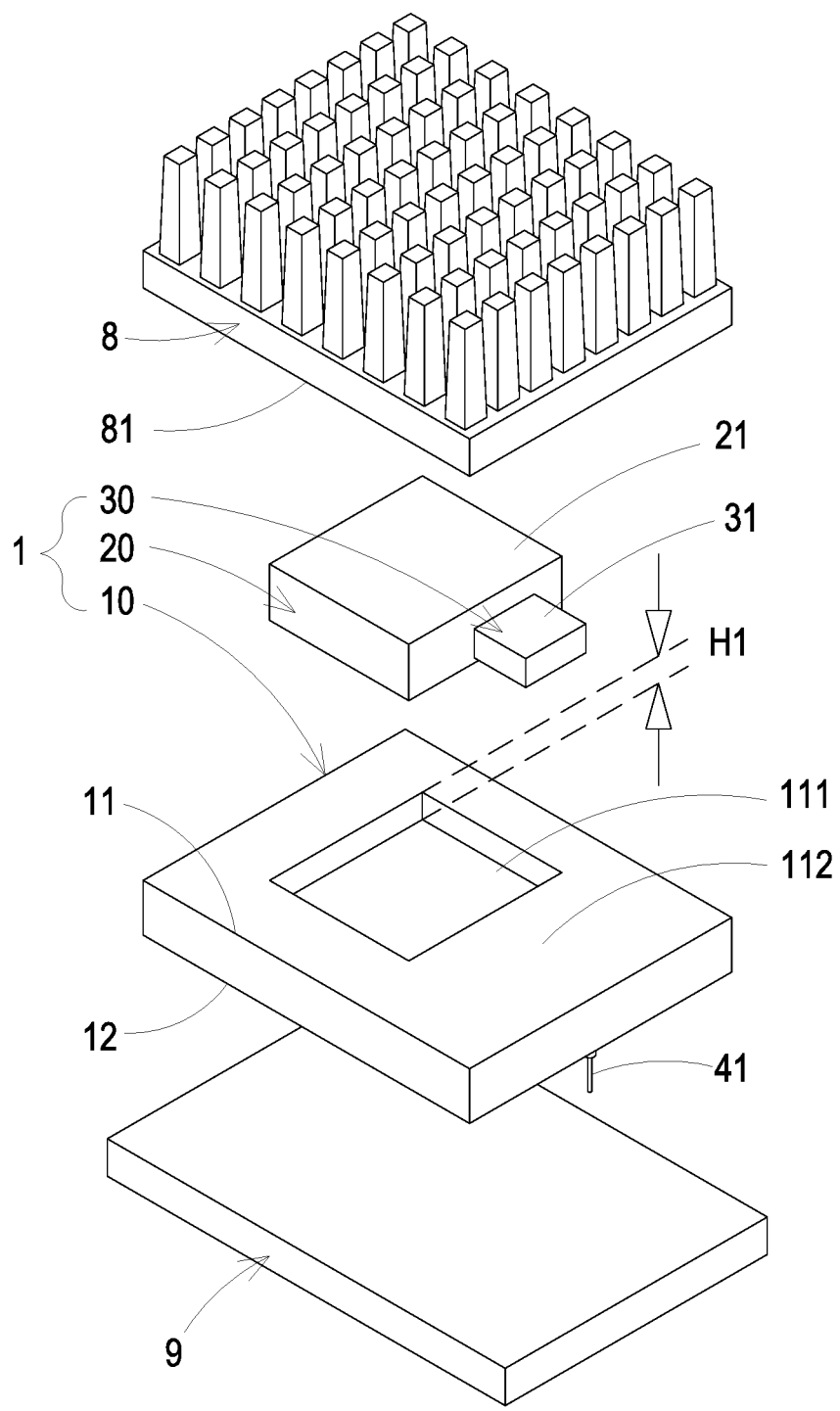
FIG. 1 is an exploded view illustrating a power module with a heat sink and a system board thereof according to a first embodiment of the present disclosure.
Figure 2:
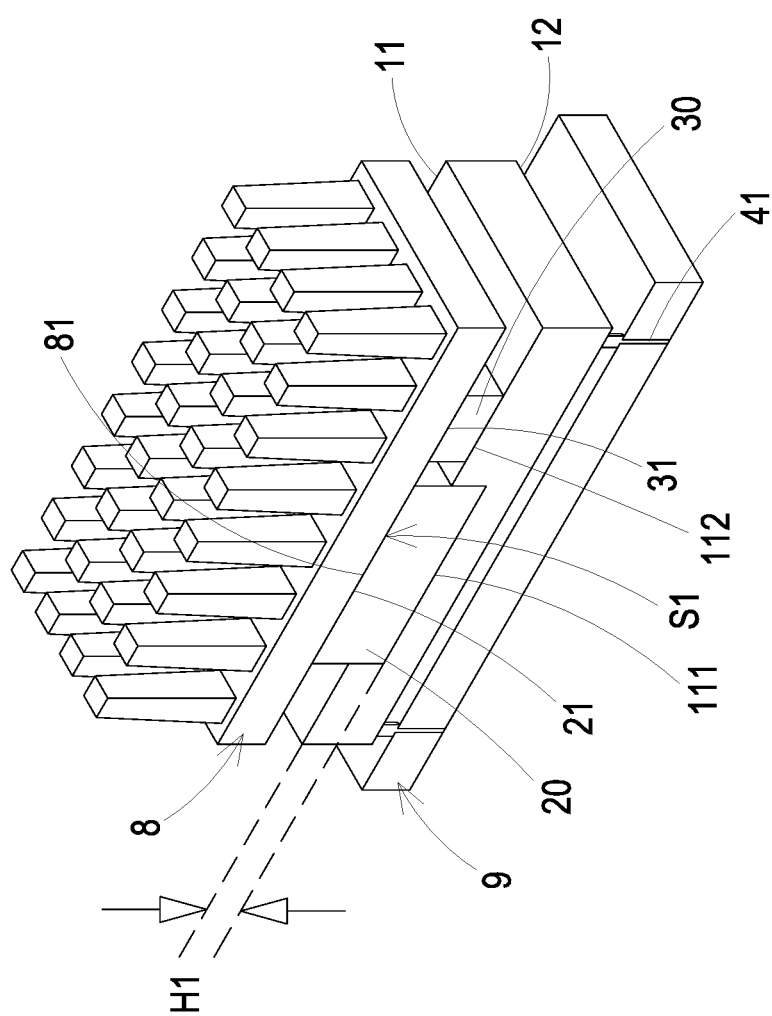
FIG. 2 is a cross-sectional structure illustrating the power module with the heat sink and the system board thereof according to the first embodiment of the present disclosure.
Figure 3:
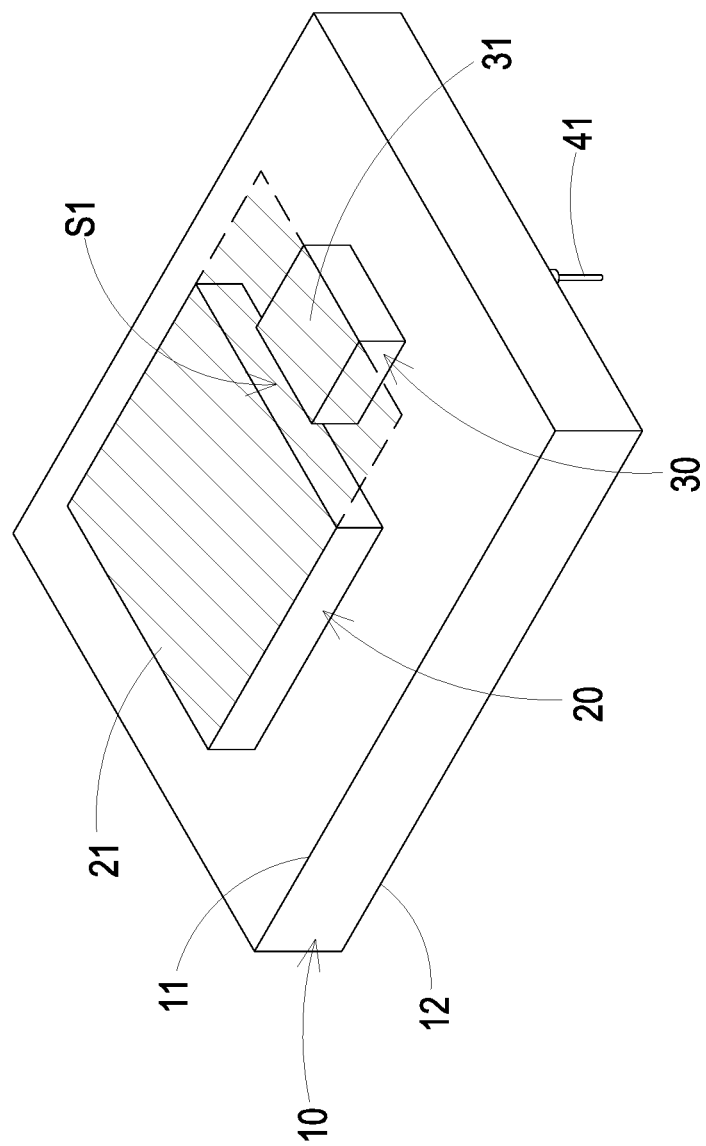
FIG. 3 is a perspective structural view illustrating the power module according to the first embodiment of the present disclosure.

FIG. 1 is an exploded view illustrating a power module with a heat sink and a system board thereof according to a first embodiment of the present disclosure. FIG. 2 is a cross-sectional structure illustrating the power module with the heat sink and the system board thereof according to the first embodiment of the present disclosure. FIG. 3 is a perspective structural view illustrating the power module according to the first embodiment of the present disclosure. Firstly, as shown in FIGS. 1, 2 and 3, the power module 1 can be for example but not limited to a DC/DC power module. The power module 1 includes a circuit board 10, at least one first heat-generating component 20 and at least one second heat-generating component 30. The circuit board 10 includes a first side 11 and a second side 12. The first side 11 and the second side 12 are opposite to each other. In the embodiment, the circuit board 10 further includes at least one first plane 111 and at least one second plane 112 disposed on the first side 11. A first height difference H1 is formed between the at least one first plane 111 and the at least one second plane 112. Preferably but not exclusively, the at least one first heat-generating component 20 and the at least one second heat-generating component 30 are a magnetic component and a switch component, respectively. The at least one first heat-generating component 20 is a thicker magnetic component and disposed on the first plane 111. The at least one second heat-generating component 30 is a thinner switch component and disposed on the at least one second plane 112. Namely, the thickness of the first heat-generating component 20 is greater than the thickness of the second heat-generating component 30. Certainly, the present disclosure is not limited thereto. In the embodiment, the at least one first heat-generating component 20 includes a first contact surface 21. The at least one second heat-generating component 30 includes a second contact surface 31. While the first heat-generating component 20 is attached to the first plane 111 and the second heat-generating component 30 is attached to the second plane 112, the at least one first contact surface 21 and the at least one second contact surface 31 are matched with and located at a first collaborative plane S1 of the power module 1. In the embodiment, the first collaborative plane S1 is the slash area shown in FIG. 3. Thus, the first collaborative plane S1 of the power module 1 is advantageously assembled and fixed to a heat sink 8, so that the first contact surface 21 of the first heat-generating component 20 and the second contact surface 31 of the second heat-generating component 30 are sufficiently adhered to the heat dissipation surface 81 of the heat sink 8 and an optimal heat dissipation effect is achieved. On the other hand, the first collaborative plane S1 is one uniform plane, which is suitable for the heat dissipation surface 81 designed as a planar surface. It benefits to effectively reduce the design complexity of the heat sink 8 required for the power module 1. Moreover, it is helpful to configure the heat dissipation of, for example, a DC/DC power module and enhance the heat dissipation capability and the overall power density of the power module 1 simultaneously. Certainly, the manner of attaching the heat sink 8 to the first collaborative plane S1 of the power module 1 is not limited thereto. Preferably but not exclusively, the heat sink 8 is attached to the first collaborative plane S1 through the thermal interface materials, such as a thermal conductive sheet, a thermal conductive adhesive or a thermal conductive paste. The present disclosure is not limited thereto, and not redundantly described herein.

In the embodiment, the power module 1 further includes at least one conductive component 41. Preferably but not exclusively, the at least one conductive component 41 includes a pair of pins disposed on the second side 12 of the power module 1. In the embodiment, the power module 1 is connected to a system board 9 through the conductive component 41, which can be for example, the pair of pins soldered therebetween. In other embodiment, the power module 1 is connected to the system board 9 through a copper block pin or a copper block. The present disclosure is not limited thereto.

Figure 4:
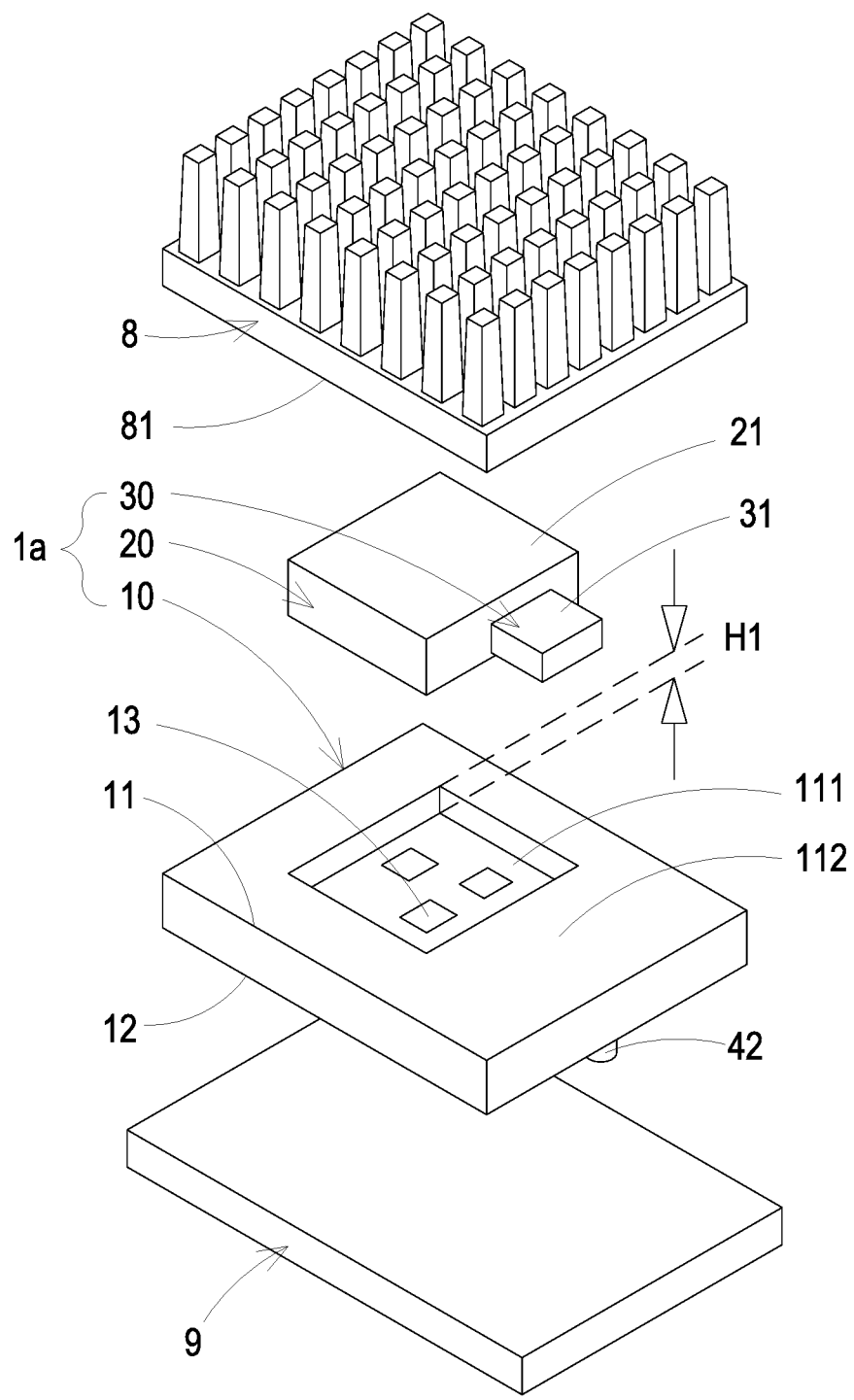
FIG. 4 is an exploded view illustrating a power module with a heat sink and a system board thereof according to a second embodiment of the present disclosure.
Figure 5:
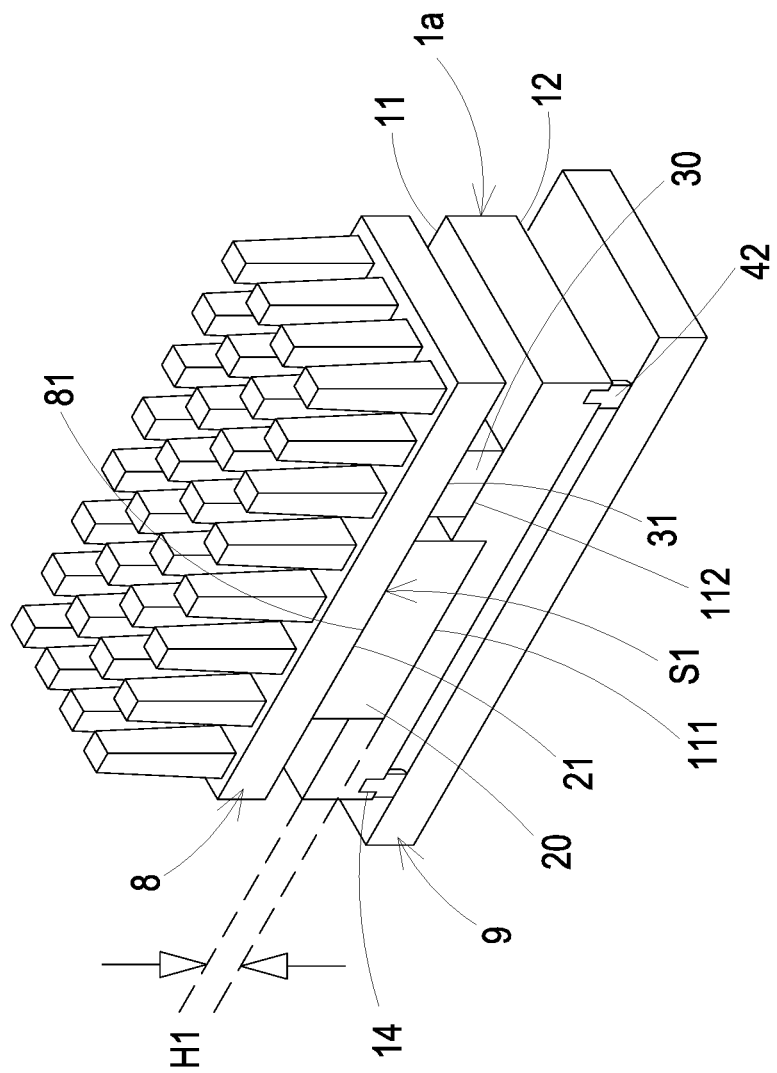
FIG. 5 is a cross-sectional structure illustrating the power module with the heat sink and the system board thereof according to the second embodiment of the present disclosure.

FIG. 4 is an exploded view illustrating a power module with a heat sink and a system board thereof according to a second embodiment of the present disclosure. FIG. 5 is a cross-sectional structure illustrating the power module with the heat sink and the system board thereof according to the second embodiment of the present disclosure. In the embodiment, the structures, elements and functions of the power module 1a are similar to those of the power module 1 in FIGS. 1 to 3, and are not redundantly described herein. Different from the power module 1 of FIGS. 1 to 3, in the embodiment, the circuit board 10 of the power module 1a further includes at least one conductive portion 13 disposed between the at least one first plane 111 and the first heat-generating component 20. The conductive portion 13 can be, for example but not limited to, a conductive adhesive or a solder. Preferably but not exclusively, the first heat-generating component 20 disposed on the first plane 111 can be a switch component, a transformer or an inductance component, which is electrically connected to the circuit board 10. Certainly, the number, arrangement, type and shape of the conductive portion 13 are adjustable according to the practical requirements, so that the first heat-generating component 20 disposed on the first plane 111 can be electrically connected with the circuit board 10 through the soldering pins with the shortest distance. The present disclosure is not limited thereto. In the embodiment, the circuit board 10 is a multilayer circuit board including, for example, N layers of circuit layers. Preferably but not exclusively, the second plane 112 is on the top layer, and the first plane 111 is disposed on the any layer between the second layer and the N−1 layer of circuit layers. The first plane 111 is adjustable and disposed on any one of the plurality of intermediate layers, so that the first height difference H1 is formed between the first plane 111 and the second plane 112. Thus, the first heat-generating component 20 having thicker thickness is disposed on the first plane 111. In the embodiment, the area of the first plane 111 is at least larger than or equal to the outer profile of the first heat-generating component 20. Certainly, the area, the shape and the size of the first plane 111 are adjustable according to the outer profile, the shape and the size of the first heat-generating component 20. The present disclosure is not limited thereto and not redundantly described herein.

Figure 6:
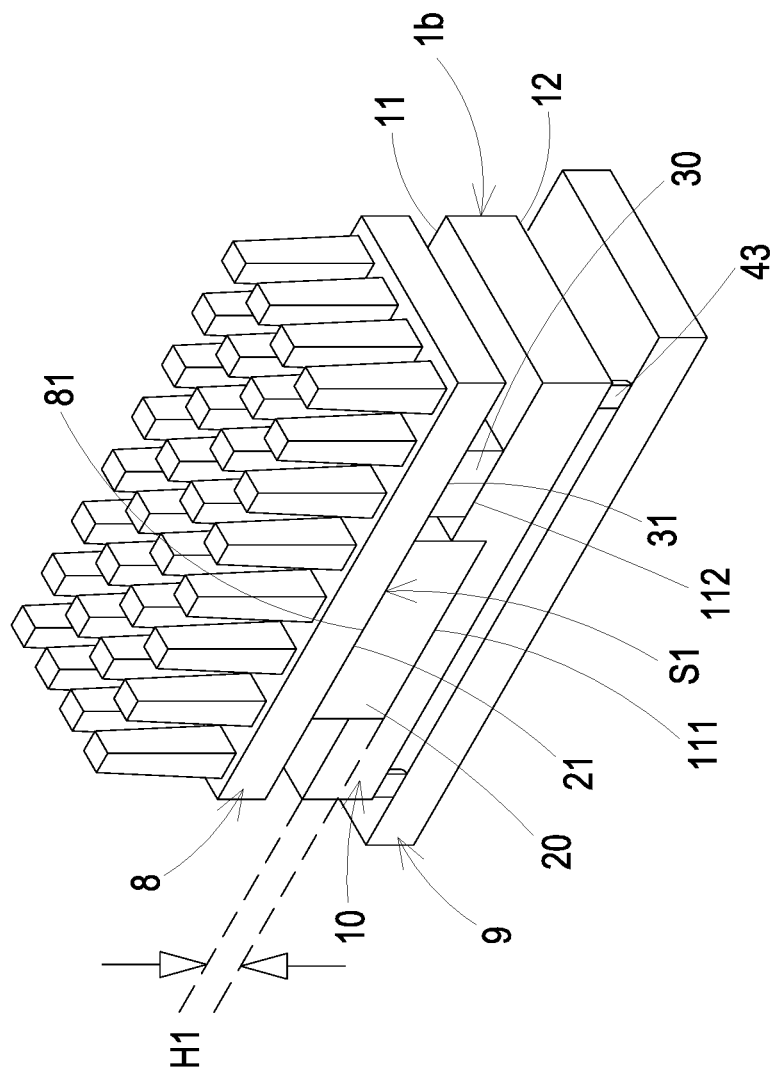
FIG. 6 is a cross-sectional structure illustrating a power module with a heat sink and a system board thereof according to a third embodiment of the present disclosure.

On the other hand, in the embodiment, the power module 1a is further connected to the system board 9 through the conductive components 42, which can be for example a set of at least two copper blocks surface-soldered to the system board 9. Preferably but not exclusively, the conductive component 42 is elongated at one end and can be soldered and fixed to the blind hole 14 of the second side 12 of the circuit board 10. The other end of the conductive component 42 is surface-soldered to the system board 9. FIG. 6 is a cross-sectional structure illustrating a power module with a heat sink and a system board thereof according to a third embodiment of the present disclosure. Similarly, in the embodiment, the power module 1a is connected to the system board 9 through the conductive components 43, which can be for example a set of at least two copper blocks surface-soldered to the system board 9. Preferably but not exclusively, the conductive component 43 is a copper block having two ends which are surface-soldered to the second side 12 of the circuit board 10 and the surface of the system board 9, respectively. It should be emphasized that the manner of mounting the power modules 1 and 1a on the system board 9 is adjustable according to the practical requirements. The present disclosure is not limited thereto, and not be redundantly described herein.

Figure 7:
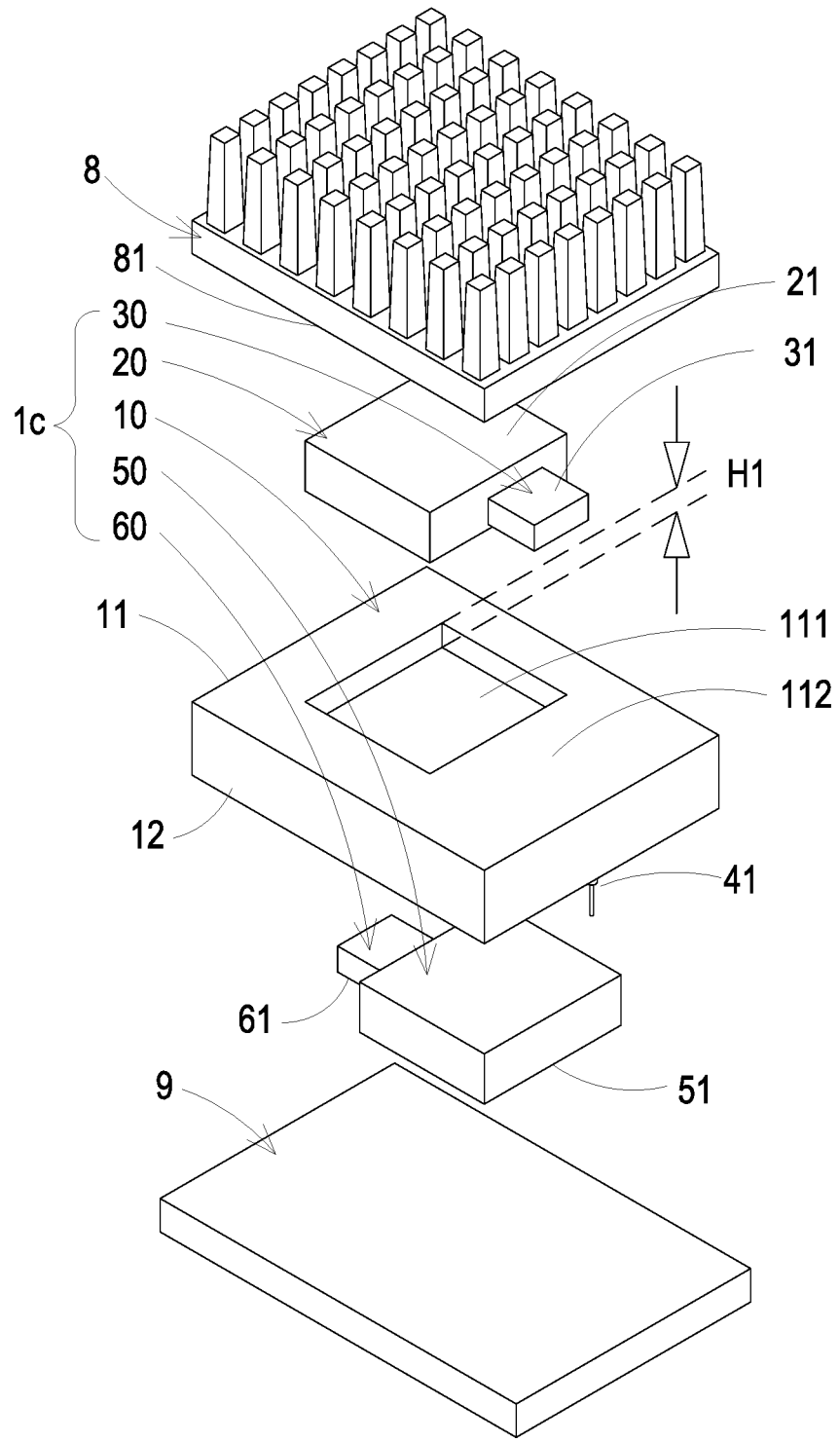
FIG. 7 is an exploded view illustrating a power module with a heat sink and a system board thereof according to a fourth embodiment of the present disclosure.
Figure 8:
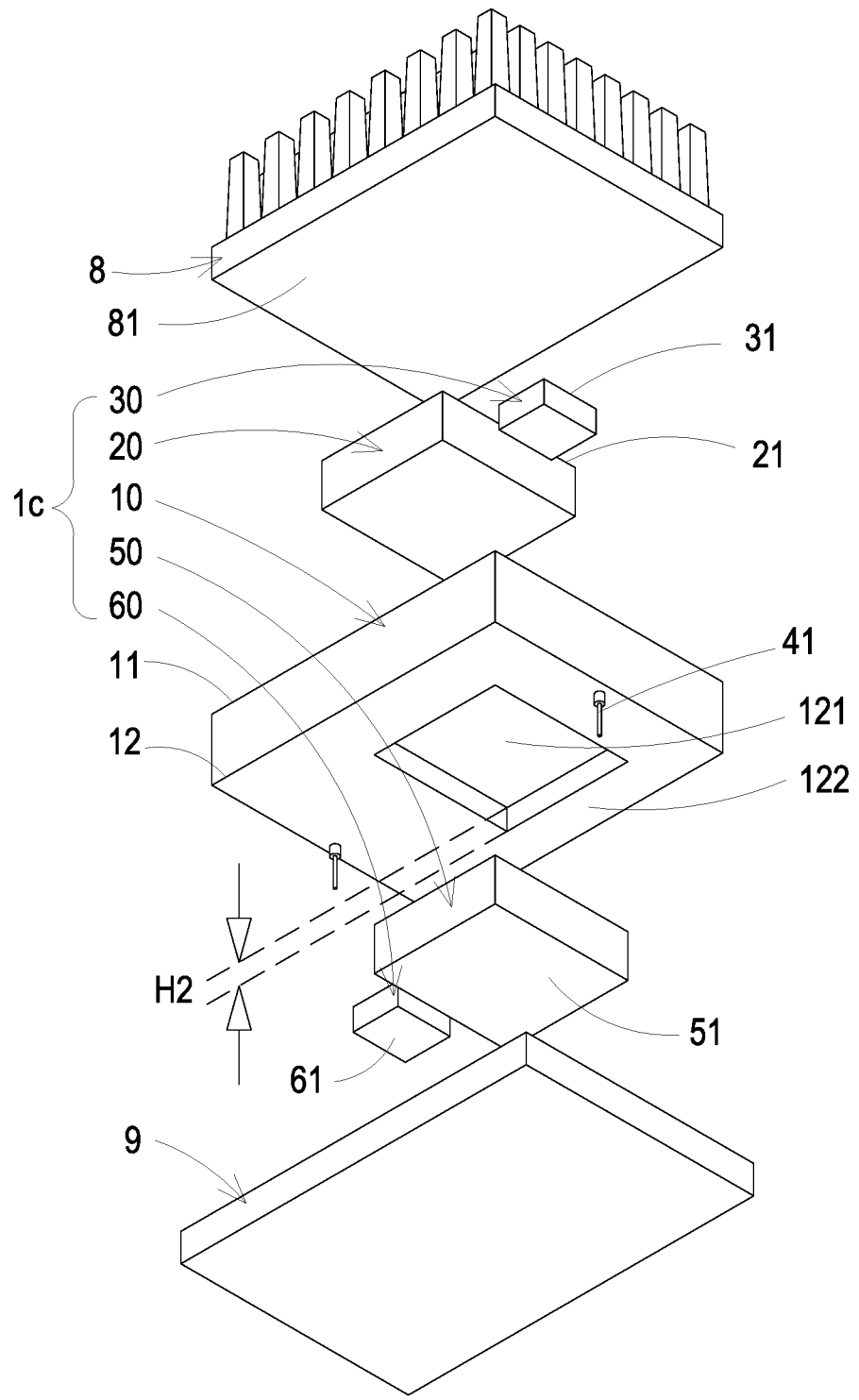
FIG. 8 is an exploded view illustrating the power module with the heat sink and the system board thereof according to the fourth embodiment of the present disclosure and taken from another viewing angle.
Figure 9:
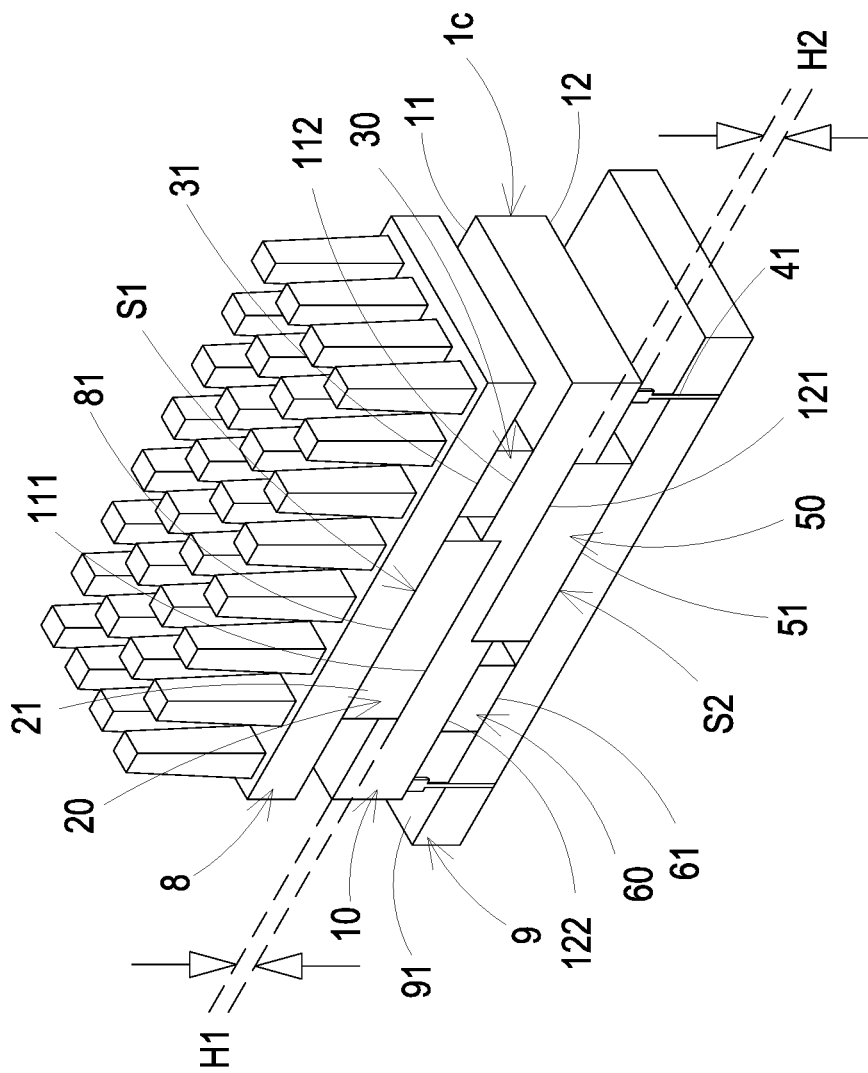
FIG. 9 is a cross-sectional structure illustrating the power module with the heat sink and the system board thereof according to the fourth embodiment of the present disclosure.
Figure 10:
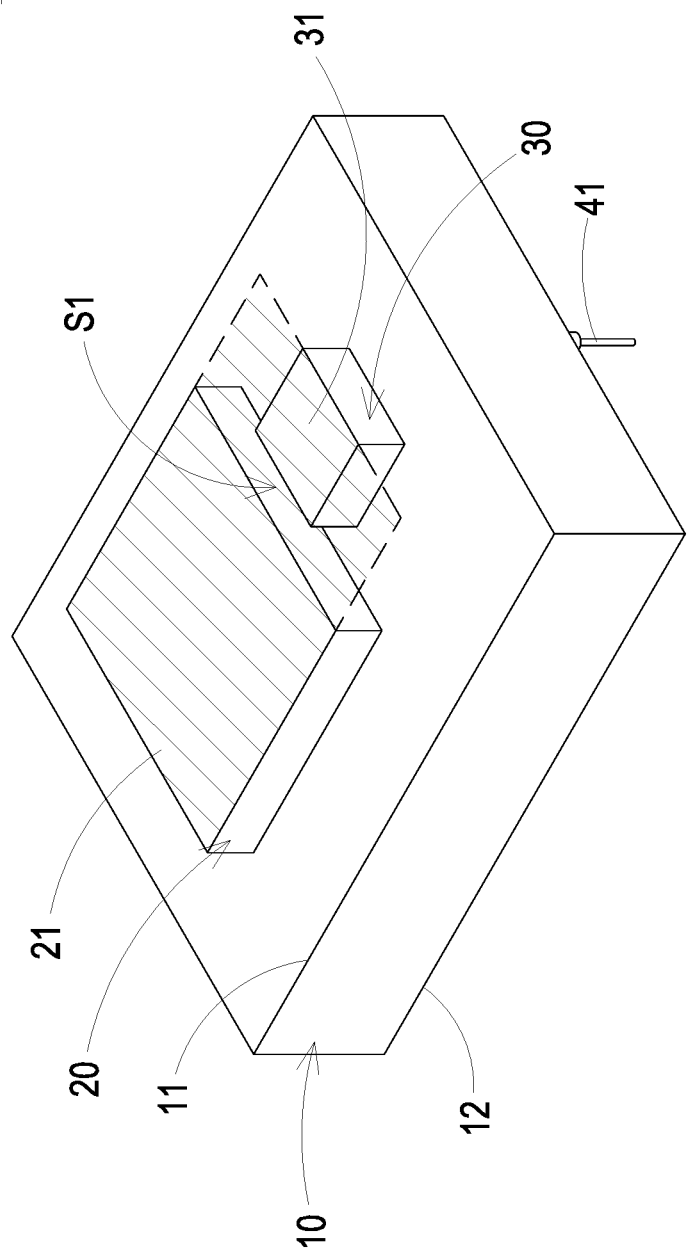
FIG. 10 is a perspective structural view illustrating the power module according to the fourth embodiment of the present disclosure.
Figure 11:
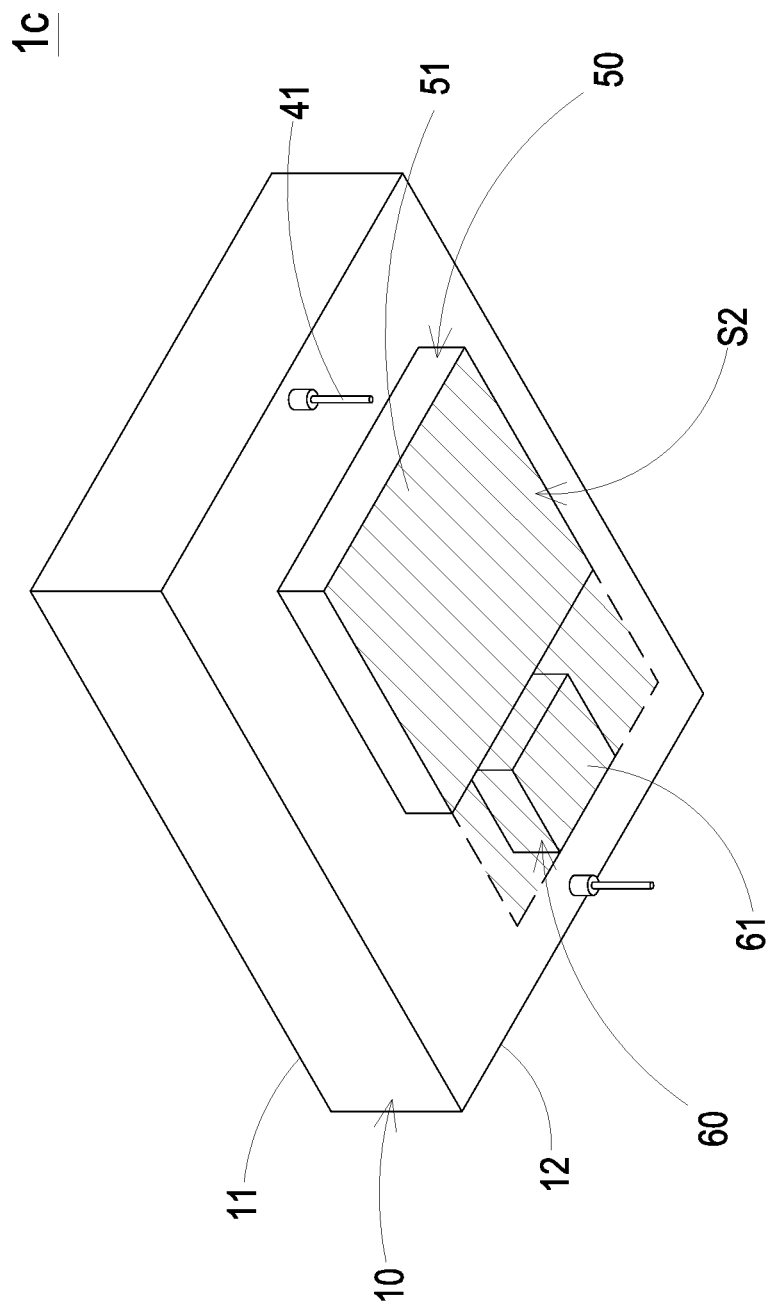
FIG. 11 is a perspective structural view illustrating the power module according to the fourth embodiment of the present disclosure and taken from another viewing angle.

FIG. 7 is an exploded view illustrating a power module with a heat sink and a system board thereof according to a fourth embodiment of the present disclosure. FIG. 8 is an exploded view illustrating the power module with the heat sink and the system board thereof according to the fourth embodiment of the present disclosure and taken from another viewing angle. FIG. 9 is a cross-sectional structure illustrating the power module with the heat sink and the system board thereof according to the fourth embodiment of the present disclosure. FIG. 10 is a perspective structural view illustrating the power module according to the fourth embodiment of the present disclosure. FIG. 11 is a perspective structural view illustrating the power module according to the fourth embodiment of the present disclosure and taken from another viewing angle. In the embodiment, the structures, elements and functions of the power module 1c are similar to those of the power module 1 in FIGS. 1 to 3, and are not redundantly described herein. Different from the power module 1 of FIGS. 1 to 3, in the embodiment, the power module 1c includes a circuit board 10, at least one first heat-generating component 20, at least one second heat-generating component 30, at least one third heat-generating component 50 and at least one fourth heat-generating component 60. The circuit board 10 includes a first side 11 and a second side 12. The first side 11 and the second side 12 are opposite to each other. In the embodiment, the circuit board 10 includes at least one first plane 111, at least one second plane 112, at least one third plane 121 and at least one fourth plane 122. The at least one first plane 111 and the at least one second plane 112 are disposed on the first side 11 and at least one first height difference H1 is formed between the at least one first plane 111 and the at least one second plane 112. The at least one third plane 121 and the at least one fourth plane 122 are disposed on the second side 12 and at least one second height difference H2 is formed between the at least one third plane 121 and the at least one fourth plane 122. The first height difference H1 and the second height difference H2 are not limited to being the same height difference. In an embodiment, the first plane 111 and the third plane 121 are vertically aligned and overlapped with each other. In another embodiment, the first plane 111 and the third plane 121 are staggered with each other but not overlapped. In other embodiment, the first plane 111 and the third plane 121 are arranged arbitrarily. The present disclosure is not limited thereto. In the embodiment, the at least one first heat-generating component 20 and the at least one second heat-generating component 30 are disposed on the at least one first plane 111 and the at least one second plane 112, respectively. The at least one first heat-generating component 20 includes at least one first contact surface 21, the at least one second heat-generating component 30 includes at least one second contact surface 31, and the at least one first contact surface 21 and the at least one second contact surface 31 are located at a first collaborative plane S1 of the power module 1c. In the embodiment, the first collaborative plane S1 is the slash area shown in FIG. 10. On the other hand, the at least one third heat-generating component 50 includes at least one third contact surface 51, the at least one fourth heat-generating component 60 includes at least one fourth contact surface 61, and the at least one third contact surface 51 and the at least one fourth contact surface 61 are located at a second collaborative plane S2 of the power module 1c. In the embodiment, the second collaborative plane S2 is the slash area shown in FIG. 11. Consequently, the first collaborative plane S1 and the second collaborative plane S2 are formed on the first side 11 and the second side 12 of the power module 1c, respectively. Thus, the first collaborative plane S1 of the power module 1c is advantageously assembled and fixed to a heat sink 8, so that the first contact surface 21 of the first heat-generating component 20 and the second contact surface 31 of the second heat-generating component 30 are sufficiently adhered to the heat dissipation surface 81 of the heat sink 8 and an optimal heat dissipation effect is achieved. Moreover, the second collaborative plane S2 of the power module 1c is advantageously assembled and fixed to a system board 9, so that the third contact surface 51 of the third heat-generating component 50 and the fourth contact surface 61 of the fourth heat-generating component 60 are sufficiently adhered to the surface 91 of the system board 9 and it benefits to simplify the overall system design. In other words, while the power module 1c of the present disclosure is applied to, for example, a DC/DC power module, the power module 1c is disposed between the heat sink 8 and the system board 9. Consequently, the optimal heat dissipation effect is achieved and the overall power density is enhanced simultaneously. In other embodiments, the first collaborative plane S1 and the second collaborative plane S2 are attached to two heat sinks 8 or two system boards 9. Notably, the number and the type of the first collaborative plane S1 and the second collaborative plane S2 attached to the heat sinks 8 or the system boards 9 are adjustable according to the practical requirement. The present disclosure is not limited thereto, and not redundantly described herein.

Figure 12:
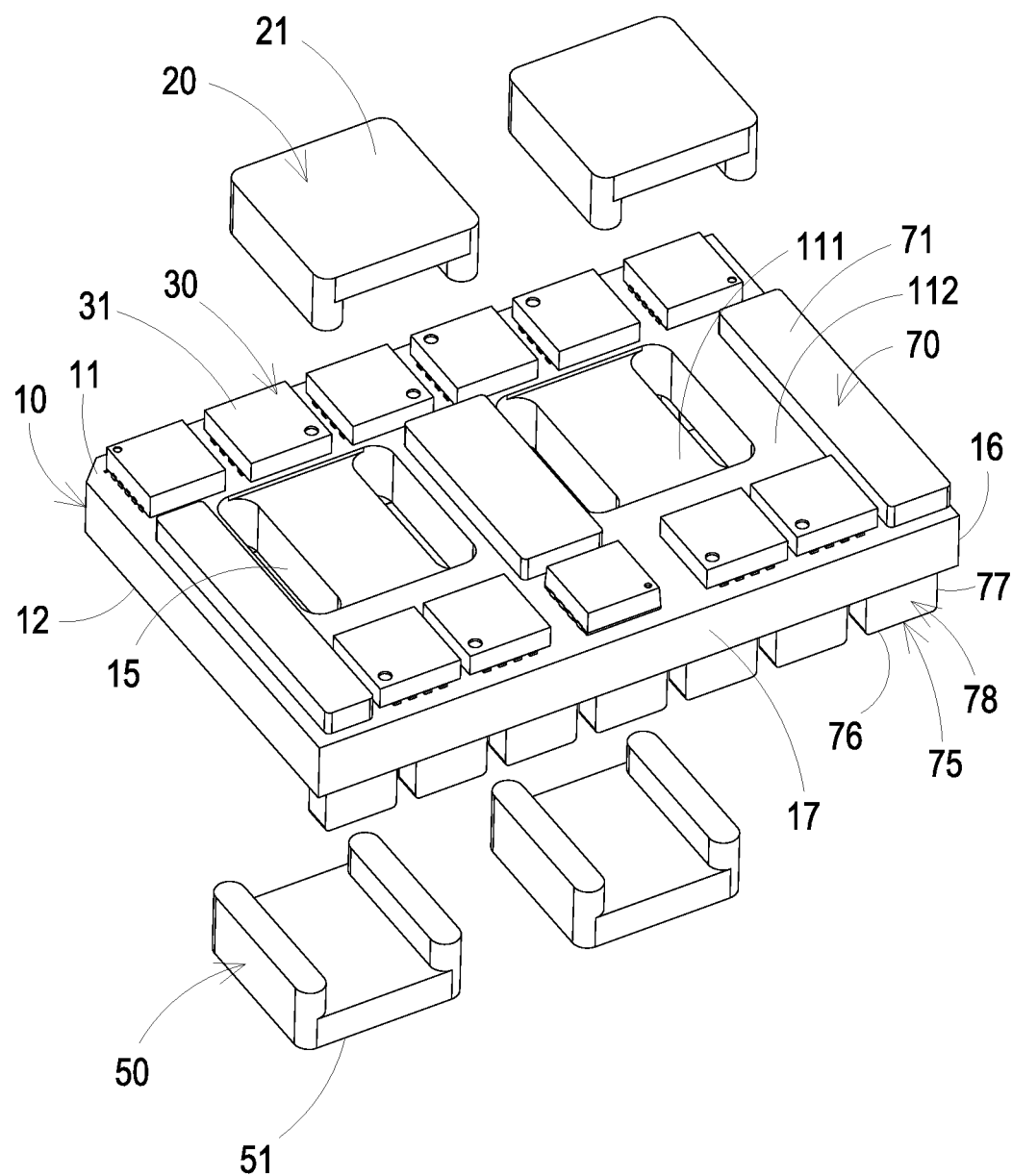
FIG. 12 is an exploded view illustrating a power module according to a fifth embodiment of the present disclosure.
Figure 13:
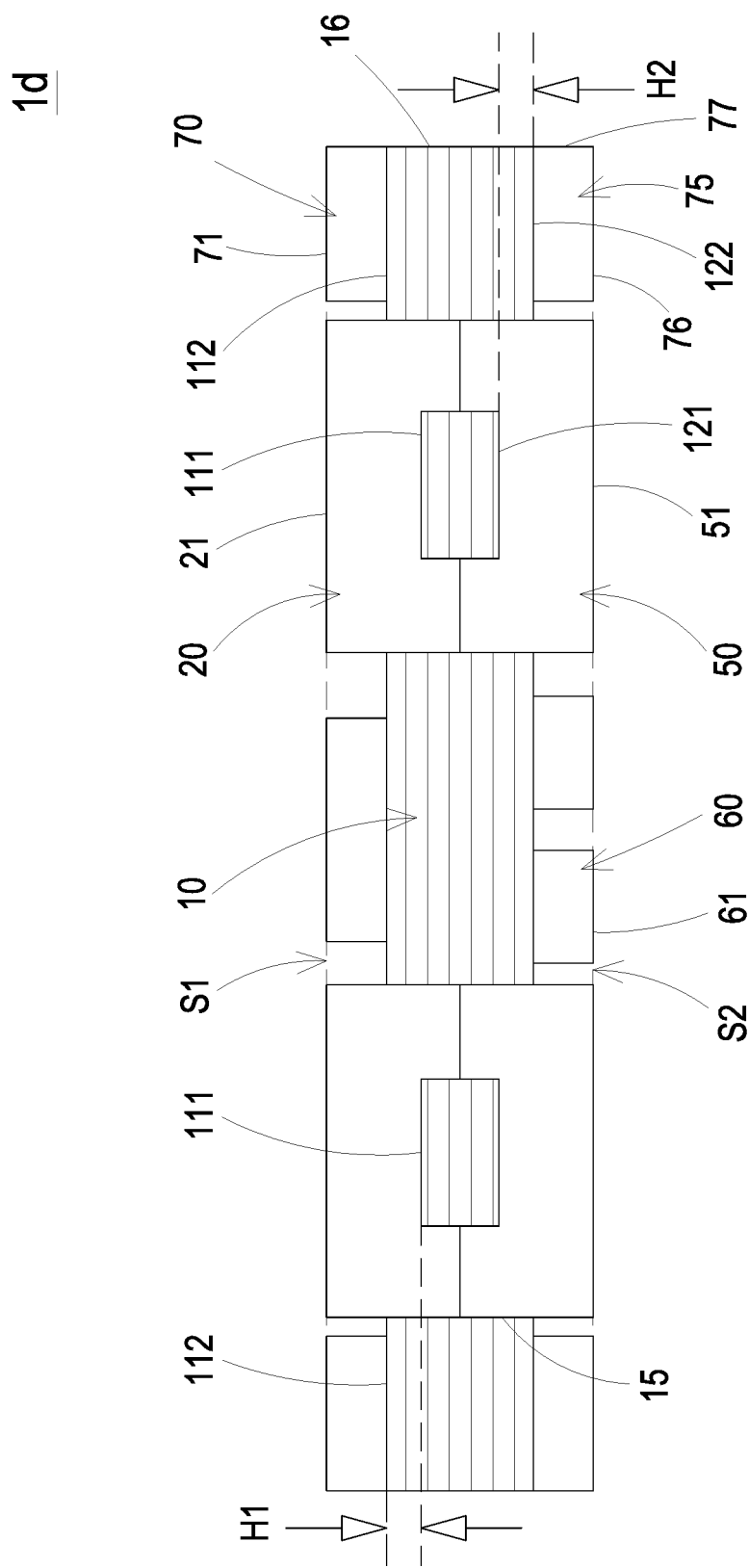
FIG. 13 is a cross-sectional view illustrating the power module according to the fifth embodiment of the present disclosure.

FIG. 12 is an exploded view illustrating a power module according to a fifth embodiment of the present disclosure. FIG. 13 is a cross-sectional view illustrating the power module according to the fifth embodiment of the present disclosure. In the embodiment, the structures, elements and functions of the power module 1d are similar to those of the power module 1c in FIGS. 7 to 11, and are not redundantly described herein. In the embodiment, the at least one first plane 111 and the at least one second plane 112 are disposed on the first side 11, and the at least one first height difference H1 is formed between the at least one first plane 111 and the at least one second plane 112. Moreover, the at least one third plane 121 and the at least one fourth plane 122 are disposed on the second side 12, and the at least one second height difference H2 is formed between the at least one third plane 121 and the at least one fourth plane 122. Different from the power module 1c of FIGS. 7 to 11, in the embodiment, the circuit board 10 of the power module 1d further includes two openings 15 running through the first plane 111 and the third plane 121. The first heat-generating component 20 and the third heat-generating component 50 includes a first magnetic core and a second magnetic core, respectively. The first magnetic core and the second magnetic core are connected with each other through the two openings 15, and a transformer is formed according to the two magnetic cores and a planar winding (not shown) on the circuit board 10. Preferably but not exclusively, the second heat-generating component 30 disposed on the first side 11 of the circuit board 10 can be a single-sided heat-dissipating MOSFET or a double-sided heat-dissipating MOSFET, and is disposed on the second plane 112 of the circuit board 10. The first magnetic core of the first heat-generating component 20 and the MOSFET of the second heat-generating component 30 have different thicknesses, but the first height difference H1 is adjustable to make the first contact surface 21 of the first heat-generating component 20 and the second contact surface 31 of the second heat-generating component 30 be configured as the first collaborative plane S1. In that, the heat generated by the second heat-generating component 30 such as the MOSFET can be rapidly dissipated away through the circuit board 10 and dissipated away through the heat dissipation surface 81 of the heat sink 8.

In the embodiment, the power module 1d further includes a first metal device 70, for example a metal copper bar, disposed on the second plane 112 and located on the first side 11. Preferably but not exclusively, the first metal device 70 has the thickness similar to that of the second heat-generating component 30. In the embodiment, the first metal device 70 includes a first metal contact surface 71, located at the first collaborative plane S1 of the first side 11. The first metal device 70 can be fixed to the second plane 112 of the circuit board 10 by surface-soldering or an adhesive. In the embodiment, the first metal contact surface 71, the first contact surface 21 and the second contact surface 31 are located at the first collaborative surface S1. In the embodiment, when the heat sink 8 is attached to the first collaborative plane S1, since the first metal device 70 have good thermal conducting characteristics and it benefits to enhance the heat dissipation capability of the power module 1d. Moreover, the first metal device 70 such as a metal copper bar can be added to increase the pressure resistance and the supporting ability of the power module 1d.

Moreover, in the embodiment, a second metal device 75, for example a leading frame, is disposed on the second side 12 of the circuit board 10. The second metal device 75 includes a first metal contact surface 76. Preferably but not exclusively, the third heat-generating component 50 is the second magnetic core and the fourth heat-generating component 60 is the other switch component. The first metal contact surface 76, the third contact surface 51 of the third heat-generating component 50 and the fourth contact surface 61 of the fourth heat-generating component 60 are located at the second collaborative surface S2. Moreover, the second metal device 75 includes a second metal contact surface 77 and a third metal contact surface 78, which are formed on a first lateral wall 16 and a second lateral wall 17 of the power module 1d. The tin can be further electroplated thereon for electrical connection. Since the second metal device 75 has good structural characteristics and disposed on the second collaborative plane S2 evenly, it is advantage to improve the integrated assembly of the power module 1d and the system board 9, and simplify the process of electric connection. In addition, the second metal device 75 such as the lead frame is added to increase the pressure resistance and support capability of the power module 1d.

Figure 14:
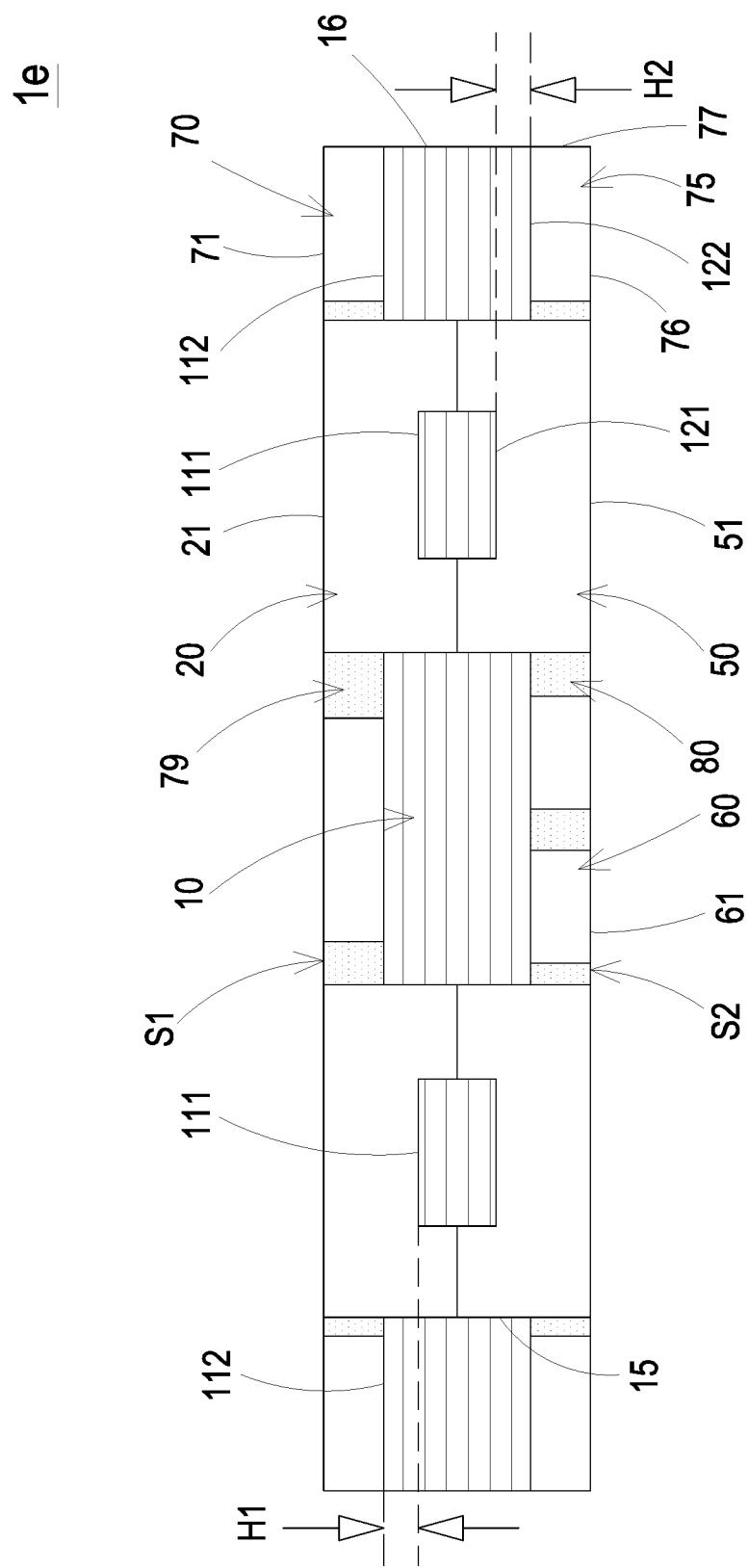
FIG. 14 is a cross-sectional view illustrating a power module according to a sixth embodiment of the present disclosure.

FIG. 14 is a cross-sectional view illustrating a power module according to a sixth embodiment of the present disclosure. In the embodiment, the structures, elements and functions of the power module 1e are similar to those of the power module 1d in FIGS. 12 to 13, and are not redundantly described herein. In an embodiment, the power module 1e includes at least one molding layer 79 disposed on the first side 11 of the circuit board 10. The at least one molding layer 79 covers the at least one first heat-generating component 20, the at least one second heat-generating component 30 (referring to FIG. 12) and the at least one first metal device 70 and exposes at least one of the at least one first contact surface 21, the at least one second contact surface 31 (referring to FIG. 12) and the first metal contact surface 71. In another embodiment, the power module 1e further includes another molding layer 80 disposed on the second side 12 of the circuit board 10. The molding layer 80 covers the at least one third heat-generating component 50, the at least one fourth heat-generating component 60 and at least one second metal device 75 and exposes the at least one fourth contact surface 61, the first metal contact surface 76, the second metal contact surface 77 and the third metal contact surface 78 (referring to FIG. 12). Alternatively, the molding layer 80 exposes the at least one third contact surface 51, the at least one fourth contact surface 61, the first metal contact surface 76, the second metal contact surface 77 and the third metal contact surface 78. Notably, the molding layers 79 and 80 can package the power module 1e into one piece by using an epoxy molding compound (EMC). The at least one first contact surface 21, the at least one second contact surface 31 and the first metal contact surface 71 are configured to form the flat first collaborative plane S1. The at least one third contact surface 51, the at least one fourth contact surface 61 and the first metal contact surface 76 are configured to form the flat second collaborative plane S2. Consequently, the flat structure of the power module 1e is achieved. It benefits to reduce the design complexity of the heat sink 8 and the system board 9 and improve the power density. In an embodiment, after packaging by the epoxy molding compound (EMC), the first collaborative plane S1 is formed by polishing the molding layer 79 to expose at least one of the at least one first contact surface 21 and the first metal contact surface 71. The second collaborative plane S2 is formed by polishing the molding layer 80 to expose the at least one fourth contact surface 61, the first metal contact surface 76 and the second metal contact surface 77. Alternatively, the at least one third contact surface 51, the at least one fourth contact surface 61, the first metal contact surface 76, the second metal contact surface 77 and the third metal contact surface 78 are exposed. In an embodiment, the molding layer 79 can be polished selectively in the above polishing process, to form the first collaborative plane S1 merely. In another embodiment, the molding layer 80 can be polished selectively in the above polishing process, to form the second collaborative plane S2 merely. In other embodiments, the molding layer 79 and the molding layer 80 are polished to form the first collaborative plane S1 and the second collaborative plane S2 and the contact surfaces described above are exposed. Alternatively, the molding layer 79 is disposed on the first side 11 or the second side 12 merely. For example, the molding layer 79 is formed on the second side 12 of the circuit board 10 of the power module 1a of FIG. 5, and the conductive component 42 is exposed selectively. The present disclosure is not limited thereto. It should be emphasized that by forming the molding layer 79 and the molding layer 80 and polishing to expose the contact faces of some components, the tolerance of the total height of the power module in mass production can be further effectively eliminated, and the assembling convenience of the heat sink 8 or the system board 9 can be enhanced.

Taking the power module 1e as an example, in the mass production, when a plurality of power modules 1e have to be packaged simultaneously, the plurality of power modules 1e can be placed in a molding chamber, respectively, and packaged into the plurality of power modules 1e separately. Alternatively, in another embodiment, the corresponding heat-generating components can be assembled by using a connection panel of the printed circuit boards to form a plurality of power modules 1e connected on the connection panel. The entire structure of the power modules 1e connected on the connection panel is placed in a molding chamber for packaging. After packaging, the plurality of the power modules 1e are separated by using a cutting method. While being cut, the second metal contact surface 77 or the third metal contact surface 78 of the second metal device 75 can be exposed. Alternatively, the second metal contact surface 77 or the third metal contact surface 78 of the second metal device 75 is exposed by polishing. In an embodiment, the tin can be further electroplated on the second metal contact surface 77 and the third metal contact surface 78 for electrical connection. The present disclosure is not limited thereto.

In addition, when the power module 1e is packaged in the molding layer 79, in order to avoid the phenomenon that the soldered joints on the circuit board 10 may be re-melted during the packaging process, the conductive adhesive may be used instead of the solder to adhere the heat-generating components to the circuit board 10. The conductive adhesive is cured after being heated at a specific temperature. In that, when the power module 1e is molded, the phenomenon of secondary re-melting does not occur. In other embodiments, each heat-generating component independently disposed on the circuit board 10 includes a pin coated with a material of AgPdCu to effectively prevent the problem that the pins are easily oxidized after the conductive adhesive is applied. However, it is not essential feature to limit the present disclosure and not redundantly described herein.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
  a circuit board comprising a first side and a second side opposite to each other, wherein the circuit board comprises at least one first plane and at least one second plane, which are disposed on a surface of the first side, and a first height difference is formed between the at least one first plane and the at least one second plane; and
  at least one first heat-generating component and at least one second heat-generating component disposed on the at least one first plane and the at least one second plane, respectively, wherein the at least one first heat-generating component comprises at least one first contact surface, the at least one second heat-generating component comprises at least one second contact surface, and the at least one first contact surface and the at least one second contact surface are coplanar with a first collaborative plane of the power module.

2. The power module according to claim 1, further comprising a heat sink having a heat-dissipation surface matched with the first collaborative plane, wherein the heat-dissipation surface is attached to the at least one first contact surface and the at least one second contact surface.

3. The power module according to claim 1, wherein the at least one first heat-generating component and the at least one second heat-generating component are one selected from the group consisting of a magnetic component, a switch component, a transformer and combinations thereof.

4. The power module according to claim 3, wherein the at least one first plane and the first collaborative plane have a distance greater than that of the at least one second plane and the first collaborative plane, and the magnetic component is disposed on the at least one first plane.

5. The power module according to claim 3, wherein the circuit board comprises at least one conductive portion disposed between the at least one first plane and the first heat-generating component, wherein the at least one first plane and the first collaborative plane have a distance greater than that of the at least one second plane and the first collaborative plane, and wherein the at least one conductive portion comprises a conductive adhesive or a solder.

6. The power module according to claim 3, further comprising a metal device disposed on the first side and electrically connected to the circuit board, wherein the metal device comprises a first metal contact surface located at the first collaborative plane of the power module, and wherein the metal device further comprises a second metal contact surface located at a lateral wall of the power module.

7. The power module according to claim 6, further comprising a molding layer disposed on the first side of the circuit board, wherein the molding layer covers the at least one first heat-generating component, the at least one second heat-generating component and the metal device, and exposes at least one of the at least one first contact surface, the at least one second contact surface, the first metal contact surface and the second metal contact surface.

8. The power module according to claim 7, wherein the first collaborative plane is formed by polishing the molding layer, to expose at least one of the at least one first contact surface, the at least one second contact surface, the first metal contact surface and the second metal contact surface.

9. The power module according to claim 1, further comprising a conductive component disposed on the second side of the circuit board, wherein the conductive component is one selected from the group consisting of a pin, a copper block pin and a copper block.

10. The power module according to claim 1, wherein the circuit board is a multilayer circuit board comprising a plurality of intermediate layers, and the at least one first plane is disposed on at least one of the plurality of intermediate layers.

11. A power module comprising:
a circuit board comprising a first side and a second side opposite to each other, wherein the circuit board comprises at least one first plane, at least one second plane, at least one third plane, and at least one fourth plane, wherein the at least one first plane and the at least one second plane are disposed on the first side and a first height difference is formed between the at least one first plane and the at least one second plane, wherein the at least one third plane and the at least one fourth plane are disposed on the second side and a second height difference is formed between the at least one third plane and the at least one fourth plane;
at least one first heat-generating component and at least one second heat-generating component disposed on the at least one first plane and the at least one second plane, respectively, wherein the at least one first heat-generating component comprises at least one first contact surface, the at least one second heat-generating component comprises at least one second contact surface, and the at least one first contact surface and the at least one second contact surface are located at a first collaborative plane of the power module; and
at least one third heat-generating component and at least one fourth heat-generating component disposed on the at least one third plane and the at least one fourth plane, respectively, wherein the at least one third heat-generating component comprises at least one third contact surface, the at least one fourth heat-generating component comprises at least one fourth contact surface, and the at least one third contact surface and the at least one fourth contact surface are located at a second collaborative plane of the power module.

12. The power module according to claim 11, further comprising at least one heat sink having a heat-dissipation surface matched with one of the first collaborative plane and the second collaborative plane, wherein the heat-dissipation surface is attached to the at least one first contact surface and the at least one second contact surface, or attached to the at least one third contact surface and the at least one fourth contact surface.

13. The power module according to claim 11, wherein one of the first collaborative plane and the second collaborative plane is attached to a system board.

14. The power module according to claim 11, wherein the at least one first plane and the first collaborative plane have a distance greater than that of the at least one second plane and the first collaborative plane, and the at least one third plane and the second collaborative plane have a distance greater than that of the at least one fourth plane and the second collaborative plane, wherein the circuit board comprises at least two openings running through the first plane and the third plane, and the first heat-generating component and the third heat-generating component comprise a first magnetic core and a second magnetic core, respectively, wherein the first magnetic core and the second magnetic core are connected with each other through the two openings.

15. The power module according to claim 11, wherein the at least one first heat-generating component and the at least one second heat-generating component are one selected from the group consisting of a magnetic component, a switch component, a transformer and combinations thereof, wherein the at least one third heat-generating component and the at least one fourth heat-generating component are one selected from the group consisting of a magnetic component, a switch component and a combination thereof.

16. The power module according to claim 11, further comprising at least one metal device disposed on the first side or/and the second side and electrically connected to the circuit board, wherein the at least one metal device comprises a first metal contact surface located at the first collaborative plane or/and the second collaborative plane of the power module, and wherein the at least one metal device further comprises a second metal contact surface and a third metal contact surface which are located at a first lateral wall of the power module and at a second lateral wall of the power module respectively.

17. The power module according to claim 16, further comprising a molding layer disposed on the first side or/and the second side of the circuit board, wherein the molding layer covers the at least one metal device, the at least one first heat-generating component and the at least one second heat-generating component or/and the at least one third heat-generating component and the at least one fourth heat-generating component, and exposes at least one of the at least one first contact surface, the at least one second contact surface, the at least one third contact surface, the at least one fourth contact surface, the second metal contact surface and the third metal contact surface.

18. The power module according to claim 17, wherein the first collaborative plane or/and the second collaborative plane are formed by polishing the molding layer, to expose at least one of the at least one first contact surface, the at least one second contact surface, the at least one third contact surface, the at least one fourth contact surface, the second metal contact surface and the third metal contact surface.

19. The power module according to claim 11, further comprising a molding layer disposed on the first side or/and the second side of the circuit board, wherein the molding layer covers the at least one first heat-generating component and the at least one second heat-generating component or/and the at least one third heat-generating component and the at least one fourth heat-generating component, and exposes at least one of the at least one first contact surface, the at least one second contact surface, the at least one third contact surface and the at least one fourth contact surface.

20. The power module according to claim 19, wherein the first collaborative plane or/and the second collaborative plane are formed by polishing the molding layer, to expose at least one of the at least one first contact surface, the at least one second contact surface, the at least one third contact surface and the at least one fourth contact surface.

21. The power module according to claim 11, wherein the circuit board is a multilayer circuit board comprising a plurality of intermediate layers, and the at least one first plane and the at least one third plane are disposed on at least one of the plurality of intermediate layers.

\* \* \* \* \*